United States Patent
Guler et al.

(10) Patent No.: US 11,227,863 B2
(45) Date of Patent: Jan. 18, 2022

(54) GATE ISOLATION IN NON-PLANAR TRANSISTORS

(71) Applicant: Intel Corporation, Santa Clara, CA (US)

(72) Inventors: Leonard P. Guler, Hillsboro, OR (US); Gopinath Bhimarasetti, Portland, OR (US); Vyom Sharma, Portland, OR (US); Walid M. Hafez, Portland, OR (US); Christopher P. Auth, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/990,163

(22) Filed: Aug. 11, 2020

(65) Prior Publication Data

US 2020/0373299 A1 Nov. 26, 2020

Related U.S. Application Data

(62) Division of application No. 15/777,260, filed as application No. PCT/US2015/000377 on Dec. 26, 2015, now Pat. No. 10,797,047.

(51) Int. Cl.
*H01L 27/088* (2006.01)
*H01L 29/66* (2006.01)
(Continued)

(52) U.S. Cl.
CPC .. *H01L 27/0886* (2013.01); *H01L 21/823431* (2013.01); *H01L 21/823481* (2013.01);
(Continued)

(58) Field of Classification Search
CPC .......... H01L 27/0886; H01L 29/66795; H01L 29/785; H01L 29/0649; H01L 29/517; H01L 21/823431; H01L 21/823481
(Continued)

(56) References Cited

U.S. PATENT DOCUMENTS 9,559,205 B2 * 1/2017 Chang ................. H01L 29/161
9,659,930 B1 * 5/2017 Yu ..................... H01L 29/66795
(Continued)

FOREIGN PATENT DOCUMENTS

CN        1487599        4/2004
CN      101981673        2/2011
(Continued)

OTHER PUBLICATIONS

European Patent Office, Office Action dated Aug. 14, 2020 in European patent application No. 15 911 519.5, 4 pages total.
(Continued)

*Primary Examiner* — Dao H Nguyen (74) *Attorney, Agent, or Firm* — Trop, Pruner & Hu, P.C.

(57) ABSTRACT

An embodiment includes an apparatus comprising: first and second semiconductor fins that are parallel to each other; a first gate, on the first fin, including a first gate portion between the first and second fins; a second gate, on the second fin, including a second gate portion between the first and second fins; a first oxide layer extending along a first face of the first gate portion, a second oxide layer extending along a second face of the second gate portion, and a third oxide layer connecting the first and second oxide layers to each other; and an insulation material between the first and second gate portions; wherein the first, second, and third oxide layers each include an oxide material and the insulation material does not include the oxide material. Other embodiments are described herein.

2 Claims, 6 Drawing Sheets

(51) Int. Cl.
  *H01L 29/78* (2006.01)
  *H01L 21/8234* (2006.01)
  *H01L 29/06* (2006.01)
  *H01L 29/51* (2006.01)

(52) U.S. Cl.
  CPC ........ *H01L 29/0649* (2013.01); *H01L 29/517* (2013.01); *H01L 29/66795* (2013.01); *H01L 29/785* (2013.01)

(58) Field of Classification Search
  USPC ........ 438/283, 284, 588, 596, 157; 257/401, 257/369, 327, 283, 288, 192, E21.633, 257/E21.642, E21.703, E21.421, E27.112, 257/E27.016, E27.06, E27.111, E29.296, 257/E29.298, E29.137, E29.242, E29.264
  See application file for complete search history.

(56) References Cited

U.S. PATENT DOCUMENTS

| | | | |
|---|---|---|---|
| 9,929,242 B2* | 3/2018 | Chang | H01L 29/0653 |
| 10,269,927 B2* | 4/2019 | Zhou | H01L 29/66537 |
| 2011/0256680 A1 | 10/2011 | Park et al. | |
| 2014/0319623 A1 | 10/2014 | Tsai et al. | |
| 2015/0228544 A1 | 8/2015 | Lin et al. | |
| 2015/0228647 A1 | 8/2015 | Chang et al. | |
| 2015/0236131 A1 | 8/2015 | Chang et al. | |
| 2016/0181425 A1 | 6/2016 | Bai | |
| 2017/0110454 A1 | 4/2017 | Chang | |
| 2017/0162693 A1* | 6/2017 | Bhimarasetti | H01L 21/76202 |
| 2019/0157387 A1* | 5/2019 | Wu | H01L 21/0234 |

FOREIGN PATENT DOCUMENTS

| | | |
|---|---|---|
| CN | 104160507 | 11/2014 |
| JP | 2003017710 | 1/2003 |
| WO | 2012067919 A1 | 5/2012 |

OTHER PUBLICATIONS

Chinese Patent Office, Office Action dated Aug. 4, 2021 in Chinese Patent Application No. 201580085575.0 (7 pages).
Chines Patent Office, Office Action dated Jan. 20, 2021 in Chinese patent application No. 201580085575.0, 9 pages total.
European Patent Office, Extended Search Report dated Jul. 24, 2019, in European Patent Application No. 15911519.5.
The International Searching Authority, Written Opinion of the International Searching Authority and the International Search Report dated Aug. 24, 2016 in International Application No. PCT/US2015/000377.

* cited by examiner

GATE ISOLATION IN NON-PLANAR TRANSISTORS

This application is a divisional of U.S. patent application Ser. No. 15/777,260, filed May 18, 2018, which is a § 371 national stage of international application PCT/US2015/000377, which filed Dec. 26, 2015. The content of each of the above applications is hereby incorporated by reference.

TECHNICAL FIELD

Embodiments of the invention are in the field of semiconductor devices and, in particular, non-planar transistors.

BACKGROUND

A FinFET is a transistor built around a thin strip of semiconductor material (referred to as the "fin"). The transistor includes the standard field effect transistor (FET) nodes/components: a gate, a gate dielectric, a source region, and a drain region. The conductive channel of the device resides on the outer sides of the fin beneath the gate dielectric. Specifically, current runs along both "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Figure 3A:
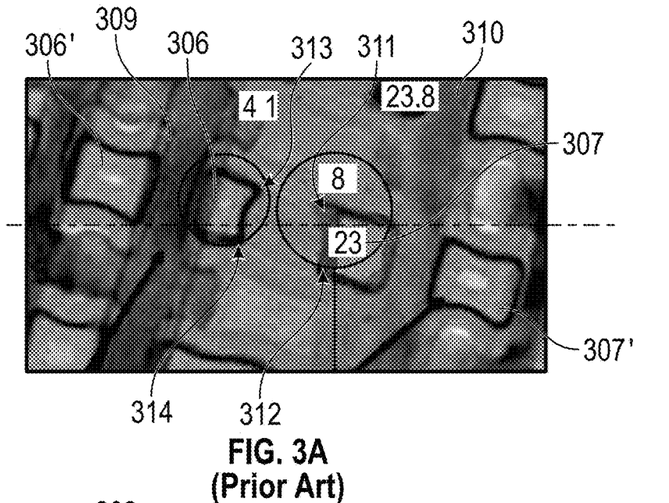
FIG. 3A includes gate residue in a conventional system.

The aforementioned gate is often defined with two patterning steps. First, an array of gates is patterned and etched. This produces many long gates, any one of which extends over and between numerous fins. In situations where transistors on neighboring fins, which share the same extended gate structure, are not meant to be operated in tandem, a second patterning step is performed to "cut" or etch the extended gate so a smaller gate is provided for each of the transistors. However, as a result of the second patterning step the ends of the gates often have "gate residue" or residual slivers. These slivers or thin portions of gate may include the polysilicon used to form the gate. These slivers, if they extend long enough, can short two adjacent gates to each other (leading to device failure). Such a sliver is shown in FIG. 3A. Sliver element 311 (a residue portion of a gate including vertical gate portions 307, 307") extends towards sliver element 313 (a residue portion of a gate including vertical gate portions 306, 306"). While sliver elements 311, 313 do not actually touch and form a short in FIG. 3A, one can easily see how the process is ripe for shorts which do occur when more residue is left. As the polysilicon is converted to metal along with the gates, the short is formed in its final form. FIG. 3A is discussed more fully below.

Conventionally, processors attempt to solve the shorting issue by requiring larger spacing between adjacent gate ends (such as ends 306, 307). This presents a penalty to optimum scaling/density for devices (e.g., at 10 nm and 14 nm nodes).

However, by using oxidation techniques described herein, the residual silicon slivers are converted to silicon oxide ($SiO_2$) either globally or selectively, which prevents formation of undesirable shorts. In other words, the once conducting slivers are no longer conductors once converted to oxide.

Figure 1:
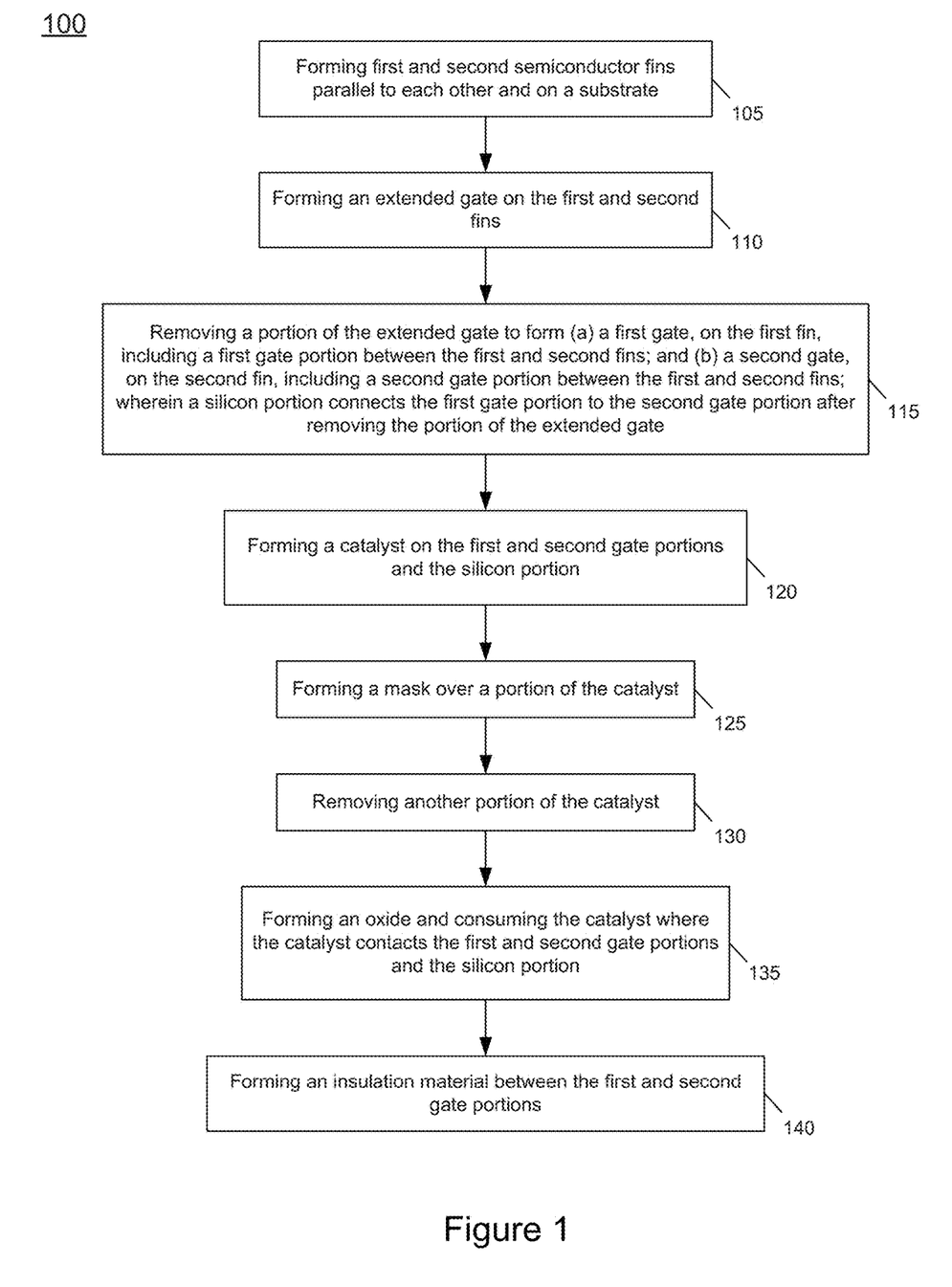
FIG. 1 depicts a process in an embodiment.

FIG. 1 depicts process 100. FIGS. 2A-2J illustrate different aspects of process 100. FIGS. 1 and 2A-2J are now addressed below.

Figure 2A:
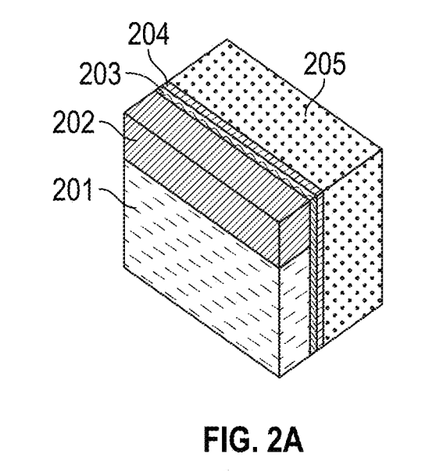
FIGS. 2A-2J depict stages of the process of the embodiment of FIG. 1.
Figure 2B:
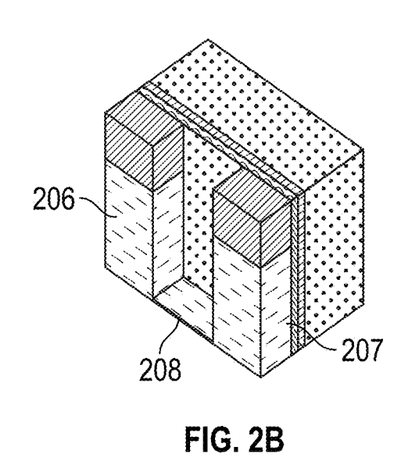

Block 105 includes forming first and second semiconductor fins parallel to each other and on a substrate. Block 110 includes forming an extended gate 201 on the first and second fins. FIG. 2A includes extended gate 201, which would extend to the left over the first fin (not shown) and to the right to extend over the second fin (not shown). The extended gate may include polysilicon. FIG. 2A further shows a hardmask 202 over extended gate 201. The mask will be used to etch the extended gate at a later point in the process. Spacer 203 may separate nitride etch stop layer (NESL) 204 from hardmask 202. Source/Drain dummy material ($SiO_2$) layer 205 (which will later be replaced by source/drain materials) may be formed adjacent layer 204.

Block 115 includes removing (e.g., etching) a portion of the extended gate 201 to form (a) a first gate, on the first fin (not shown), including a first gate portion 206 (the right vertical member of the first gate) between the first and second fins; and (b) a second gate, on the second fin, including a second gate portion 207 (the left vertical member of the first gate) between the first and second fins. Silicon portion 208 connects the first gate portion to the second gate portion after removing the portion of the extended gate. Portion 208 may include residual silicon not completely removed during the etch due to, for example, an etch with less than perfect timing that fails to remove all of the desired material. This silicon, if left, may result in a gate to gate short (such as a short between portions 206, 207).

FIG. 3A includes an example of undesirable post etch silicon. FIG. 3A illustrates fins 309, 310. First gate (whose top or horizontal portion has been removed) includes portions 306, 306'. Second gate (whose top or horizontal portion has been removed) includes portions 307, 307'. In this case no actual short is present, however a "fang" like point 311 illustrates how such a portion may be extended in other situations after the etch was completed (albeit unsuccessfully). Other pointed portions 312, 313, 314 are of varying lengths and sharpness. Again, when an etch is not entirely successful portion 311 may extend to portion 313, thereby forming a bridge that may operate as an undesirable electrical short when current is supplied to either of the gates.

Figure 2C:
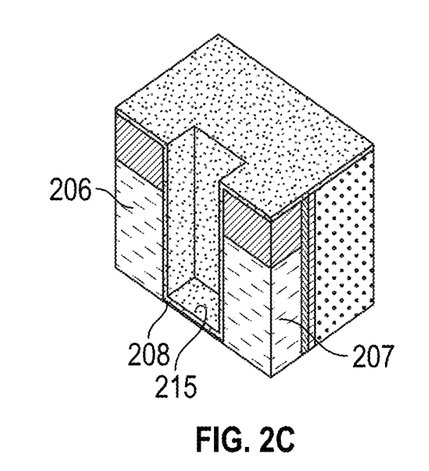
Figure 2D:
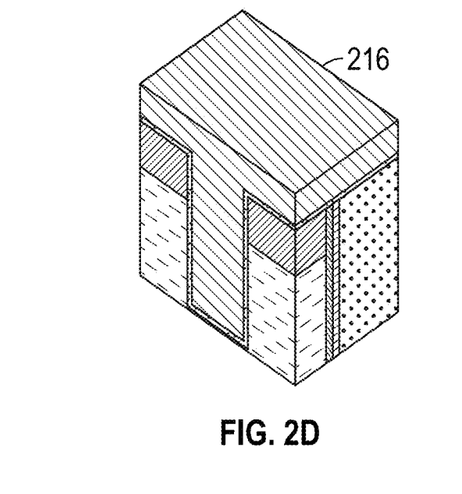
Figure 2E:
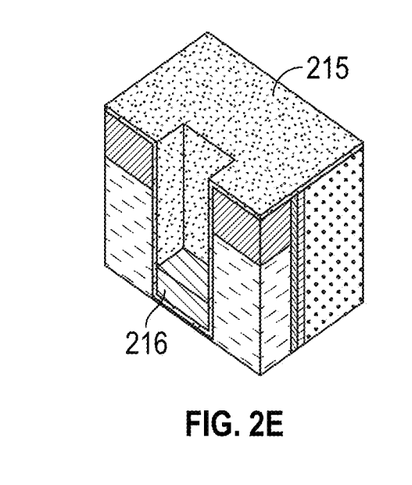
Figure 2F:
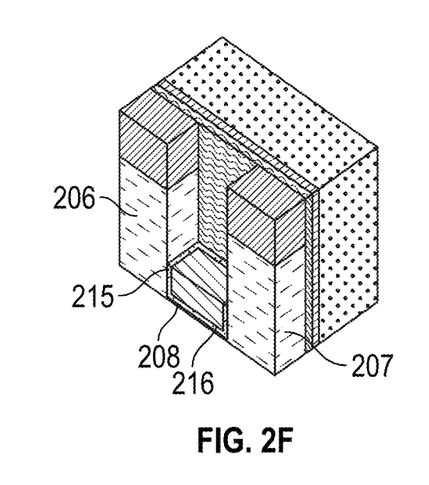
Figure 2G:
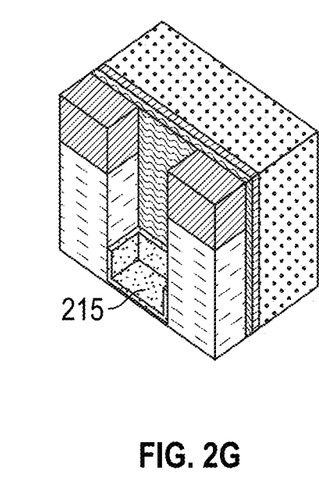
Figure 2H:
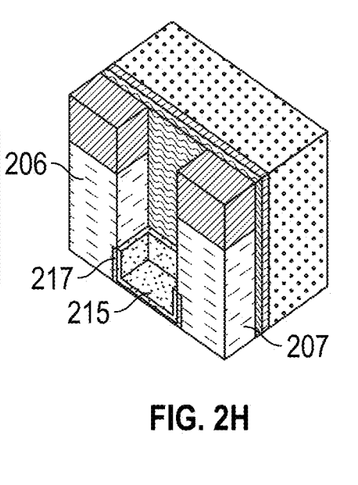
Figure 2I:
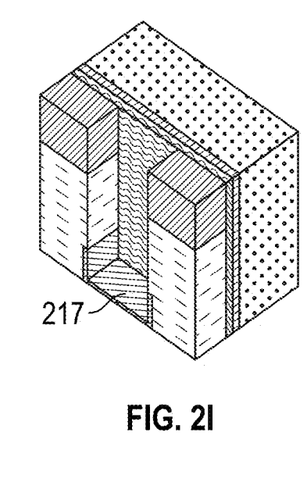
Figure 2J:
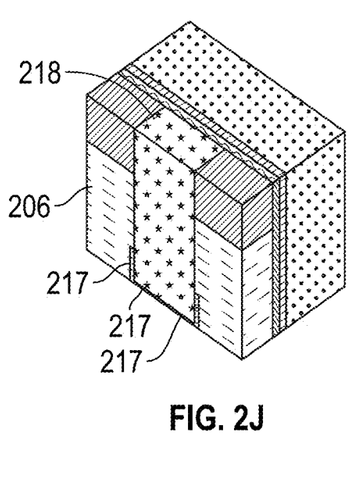

Turning to FIGS. 1 and 2C, block 120 includes forming a catalyst 215 on the first and second gate portions 206, 207 and the silicon portion 208. Catalysts may include, for example, $Al_2O_3$. Block 125 includes forming a mask 216 over a portion of the catalyst (FIG. 2D). The mask 216 may be recessed (FIG. 2E) to cover only a portion of catalyst. Block 130 includes removing a first portion of the catalyst (FIG. 2F); thereby leaving only a second portion of catalyst 215 along a bottom "U" shaped area between gate portions 206, 207, 208. The catalyst may be removed using, for example, $NH_3OH$ or dilute HF. Afterwards the remaining mask is removed (FIG. 2G) leaving a portion of catalyst 215 behind.

Block 135 includes forming an oxide 217 (FIG. 2H) and consuming the catalyst 215 (FIG. 2I) where the catalyst contacts the first and second gate portions 206, 207 and the silicon portion 208. In an embodiment, oxide 217 is silicon oxide.

Figure 3B:
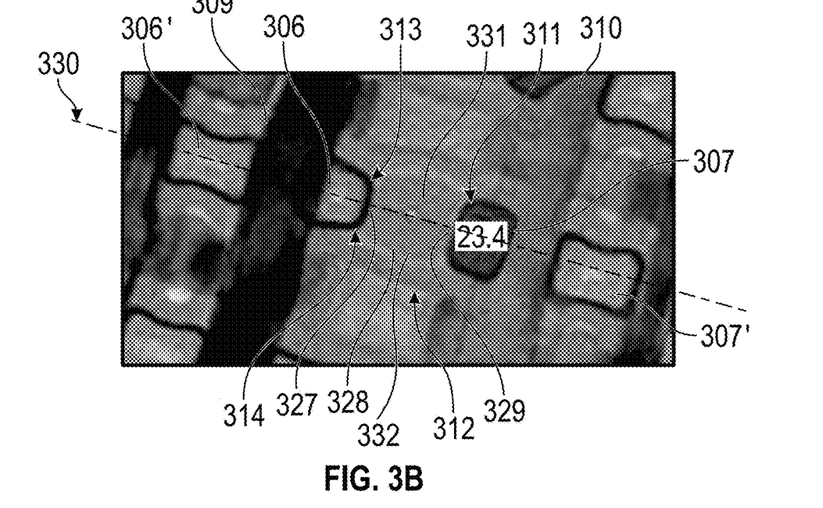
FIGS. 3B-3C include embodiments having improved gate isolation.
Figure 3C:
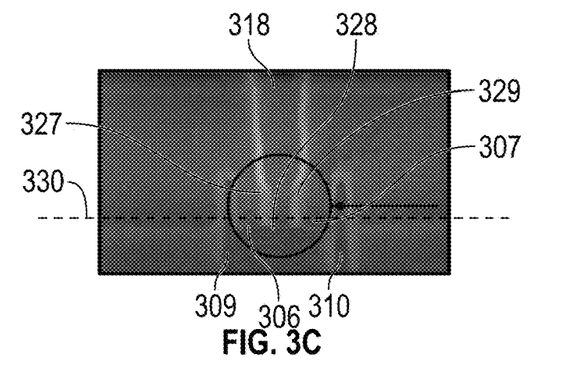

Block 140 includes forming an insulation material 218 between the first and second gate portions 206, 207. Insulation material 218 may include nitride but in other embodiments may include other dielectric materials (e.g., SiC, oxides, and the like). Insulation material 218 may include many varied types of insulators provided they are not the same material as oxide 217. For example, source/drain dummy material may include an insulator material. As a result, there needs to be etch selectivity between material 217 (which remains in final product) and materials (e.g., source/drain dummy material) that will be removed and not be included in the final product. In other words, material 218 can be an oxide in some embodiments but does not have to be an oxide in other embodiments. An embodiment uses an oxide as a dummy material but it can be any other material that can easily be removed and replaced selectively to the gate material, FIG. 3B includes a top view of an embodiment whereby portions of gates have been removed to better illustrate the embodiment. FIG. 3C includes a side view of an embodiment. FIGS. 3B and 3C are not necessarily images of the same embodiment but are used to address illustrative aspects of embodiments so their analogous parts are similarly numbered.

First and second semiconductor fins 309, 310 are parallel to each other. A first gate, on the first fin 309, includes a first gate portion 306 between the first and second fins, and another gate portion 306'. A second gate, on the second fin 310, includes a second gate portion 307 between the first and second fins and another gate portion 307'. A first oxide layer 327 extends along a first face of the first gate portion 306, a second oxide layer 329 extends along a second face of the second gate portion 307, and a third oxide layer 328 connects the first and second oxide layers to each other. Insulation material 318 is between the first and second gate portions 306, 307.

The first face is between rounded corners 313, 314 and the second face is between rounded corners 311, 312. The first and second faces oppose each other. Rounded corners 311, 312, 313, 314 of FIG. 3B stand in contrast to the pointed analogous corners or points 311, 312, 313, 314 of FIG. 3A. Further the first and second faces are substantially flat, instead of concave such as those of FIG. 3A.

The first, second, and third oxide layers 327, 329, 328 each include an oxide material and the insulation material 318 does not include the oxide material (or at least does not primarily include the oxide material except for possible portions of oxide migration and the like). In an embodiment, the oxide material of layers 327, 329, 328 includes silicon oxide and the insulating material 318 includes nitride. In an embodiment, the catalyst may include aluminum oxide. The catalyst may not be completely consumed such that the final oxide of oxide layers 327, 329, 328 includes aluminum oxide in addition to silicon oxide. In an embodiment catalyst is not consumed. The catalyst speeds up the oxidation reaction but is not consumed. The catalyst can be removed in some embodiments after the oxidation is complete but not removed in other embodiments after the oxidation is complete.

In an embodiment, the first and second gates (and gate portions 306, 306', 307, 307') each include a metal (e.g., aluminum, which has replaced polysilicon on the finished apparatus).

First horizontal axis 330 intersects the first and second fins 309, 310, the first and second gate portions 306, 307, the first and second oxide layers 327, 329, and the insulation material 318. First horizontal axis 330 does not intersect the third oxide layer 328 (because it is located above oxide layer 328). As shown in FIG. 3C, the first and second oxide layers 327, 329 are substantially vertical and the third oxide layer 328 is substantially horizontal.

No additional fin is between the first and second fins 309, 310. They are adjacent one another.

Third oxide layer 328 has first and second opposing sidewalls 331, 332 that each connect the first and second oxide layers 327, 329 to each other. Middle portions of the first and second sidewalls curve away from each other. In other words, sidewalls 331, 332 are convex such that oxide layer 328 is thickest from the midpoint of wall 331 to the midpoint of wall 332. Put another way, the third oxide layer 328 has first and second opposing sidewalls 331, 332. The first sidewall 331 connects the first and second oxide layers 327, 329 to each other at first and second contact points (i.e., corners 311, 313). The first and second contact points are a first distance (linear directly extending between corners 311, 313) from each other. Middle portions of the first and second faces (i.e., halfway between corners 313, 314 and halfway between corners 311, 312) are a second distance from each other that is less than the first distance (due to the rounding of the corners). This stands in contrast to the situation with the concave faces of FIG. 3A (where the pointed corners are closer to each other than the midpoints of the opposing faces). The convex nature of the walls may be because, for example, the oxidation that takes place is accomplished by integration of oxygen atoms into the lattice of whatever material is exposed. Material volume is therefore increased, which creates space and directs stress outwards.

As seen in FIG. 3C, the insulation material 318 extends from the third oxide layer 328 to upper portions of the first and second fins 309, 310. The insulation material is narrower adjacent the third oxide layer than the insulation layer is adjacent the upper portions of the first and second fins. This is due to the thickness of layers 327, 329 which in FIG. 3C do not extend all the way up to the top of the fins. Insulation 318 appears substantially frustoconical in FIG. 3C.

In an embodiment, the first oxide layer 327 has a first thickness adjacent the third oxide layer 328; the first oxide layer has a second thickness at an uppermost portion of the first oxide layer; and the first thickness is thicker than the second thickness. Embodiments may present the sidewall oxides 327, 329 extending various heights up the gate sidewalls (e.g., 10%, 25%, 50%, 75%, 100% of the way up the walls).

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

Figure 4:
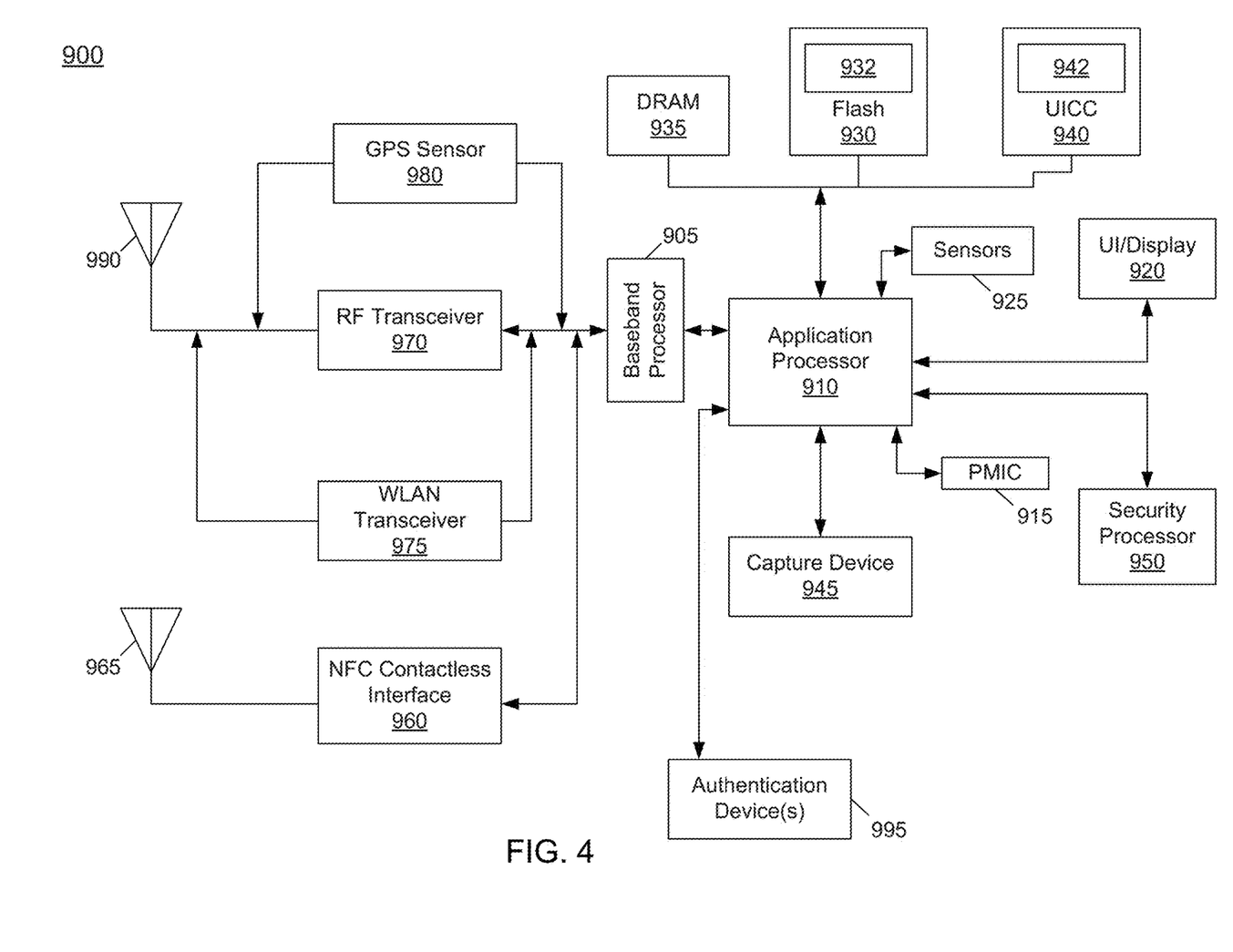
FIGS. 4-5 depict systems that include embodiments.

Referring now to FIG. 4, shown is a block diagram of an example system with which embodiments can be used. As seen, system 900 may be a smartphone or other wireless communicator or any other IoT device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 5:
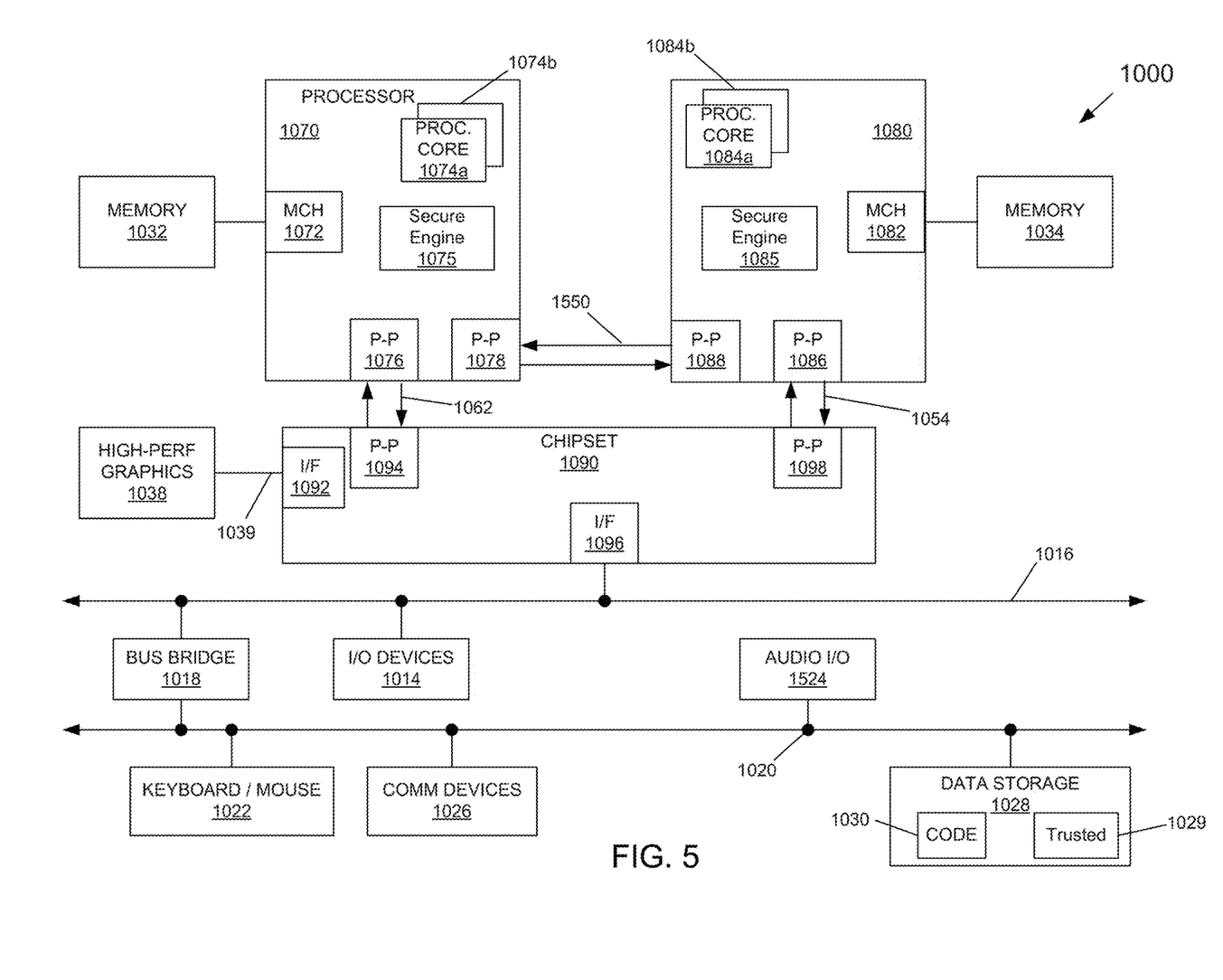

Referring now to FIG. 5, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1052 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Embodiments may include non-planar transistors having gates processed according to embodiments described herein. Such transistors may be included in, for example, processor 910, 1070 and/or memory 935, 932, 1032, 1034, 1028.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments (e.g., code for implementing the process of FIG. 1) may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following examples pertain to further embodiments.

Example 1 includes an apparatus comprising: first and second semiconductor fins that are parallel to each other; a first gate, on the first fin, including a first gate portion between the first and second fins; a second gate, on the second fin, including a second gate portion between the first and second fins; a first oxide layer extending along a first face of the first gate portion, a second oxide layer extending along a second face of the second gate portion, and a third oxide layer directly connecting the first and second oxide layers to each other; and an insulation material between the first and second gate portions; wherein the first, second, and third oxide layers each include an oxide material and the insulation material does not include the oxide material.

In example 2 the subject matter of the Example 1 can optionally include wherein a first horizontal axis intersects the first and second fins, the first and second gate portions, the first and second oxide layers, and the insulation material.

In example 3 the subject matter of the Examples 1-2 can optionally include wherein the first horizontal axis does not intersect the third oxide layer.

In example 4 the subject matter of the Examples 1-3 can optionally include wherein the first and second oxide layers are substantially vertical and the third oxide layer is substantially horizontal.

In example 5 the subject matter of the Examples 1-4 can optionally include wherein no additional fin is between the first and second fins.

In example 6 the subject matter of the Examples 1-5 can optionally include wherein the first and second faces oppose each other.

In example 7 the subject matter of the Examples 1-6 can optionally include wherein: the third oxide layer has first and second opposing sidewalls that each connect the first and second oxide layers to each other; middle portions of the first and second sidewalls curve away from each other.

In example 8 the subject matter of the Examples 1-7 can optionally include wherein the third oxide layer has first and second opposing sidewalls, connecting the first and second oxide layers to each other, which are convex with regard to the third oxide layer.

In example 9 the subject matter of the Examples 1-8 can optionally include wherein: the third oxide layer has first and second opposing sidewalls; the first sidewall connects the first and second oxide layers to each other at first and second contact points; the first and second contact points are a first distance from each other; and middle portions of the first and second faces are a second distance from each other that is less than the first distance.

In example 10 the subject matter of the Examples 1-9 can optionally include wherein the first and second faces are substantially non-curved and linear in a horizontal plane that intersects the first and second fins.

In example 11 the subject matter of the Examples 1-10 can optionally include wherein the oxide material includes silicon oxide and the insulating material includes nitride.

In example 12 the subject matter of the Examples 1-11 can optionally include wherein the oxide material includes aluminum oxide.

In example 13 the subject matter of the Examples 1-12 can optionally include wherein the oxide material includes silicon oxide and aluminum oxide.

In example 14 the subject matter of the Examples 1-13 can optionally include wherein the first and second gates each include a metal.

In example 15 the subject matter of the Examples 1-14 can optionally include wherein: the insulation material extends from the third oxide layer to upper portions of the first and second fins; and the insulation material is narrower adjacent the third oxide layer than the insulation layer is adjacent the upper portions of the first and second fins.

In example 16 the subject matter of the Examples 1-15 can optionally include wherein: the first oxide layer has a first thickness adjacent the third oxide layer; the first oxide layer has a second thickness at an uppermost portion of the first oxide layer; and the first thickness is thicker than the second thickness.

In example 17 the subject matter of the Examples 1-16 can optionally include a system-on-chip (SoC) that includes the first, second, and third oxide layers.

Example 18 includes a method comprising: forming first and second semiconductor fins parallel to each other and on a substrate; forming an extended gate on the first and second fins; removing a portion of the extended gate to form (a) a first gate, on the first fin, including a first gate portion between the first and second fins; and (b) a second gate, on the second fin, including a second gate portion between the first and second fins; wherein a silicon portion connects the first gate portion to the second gate portion after removing the portion of the extended gate; forming a catalyst on the first and second gate portions and the silicon portion; forming a mask over a portion of the catalyst; removing another portion of the catalyst; forming an oxide and consuming the catalyst where the catalyst contacts the first and second gate portions and the silicon portion; and forming an insulation material between the first and second gate portions.

In example 19 the subject matter of the Example 18 can optionally include wherein: forming the oxide comprises extending a first oxide layer along a first face of the first gate portion, extending a second oxide layer along a second face of the second gate portion, and connecting the first and second oxide layers to each other using a third oxide layer; and the first, second, and third oxide layers each include an oxide material and the insulation material does not include the oxide material.

Example 20 includes an apparatus comprising: a first gate, on a first semiconductor fin, including a first gate portion and a second gate, on a second semiconductor fin, including a second gate portion; an oxide layer (a) extending along opposing faces of the first and second gate portions, and (b) with opposing sidewalls connecting the opposing faces to each other; and an insulation material between the first and second gate portions; wherein the oxide layer includes an oxide material not included in the insulation material; wherein the opposing sidewalls are convex.

In example 21 the subject matter of the Example 20 can optionally include wherein a first horizontal axis intersects the first and second fins, the first and second gate portions, the oxide layer, and the insulation material.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method comprising:
    forming first and second semiconductor fins parallel to each other and on a substrate;
    forming an extended gate on the first and second fins;
    removing a portion of the extended gate to form (a) a first gate, on the first fin, including a first gate portion between the first and second fins; and (b) a second gate, on the second fin, including a second gate portion between the first and second fins; wherein a silicon portion connects the first gate portion to the second gate portion after removing the portion of the extended gate;
    forming a catalyst on the first and second gate portions and the silicon portion;
    forming a mask over a portion of the catalyst;
    removing another portion of the catalyst;
    forming an oxide and consuming the catalyst where the catalyst contacts the first and second gate portions and the silicon portion; and
    forming an insulation material between the first and second gate portions.

2. The method of claim 1, wherein:
    forming the oxide comprises extending a first oxide layer along a first face of the first gate portion, extending a second oxide layer along a second face of the second gate portion, and connecting the first and second oxide layers to each other using a third oxide layer; and
    the first, second, and third oxide layers each include an oxide material and the insulation material does not include the oxide material.

* * * * *